United States Patent
Imai et al.

(10) Patent No.: US 7,180,373 B2
(45) Date of Patent: Feb. 20, 2007

(54) HIGH FREQUENCY POWER AMPLIFIER MODULE AND SEMICONDUCTOR INTEGRATED CIRCUIT DEVICE

(75) Inventors: Shun Imai, Komoro (JP); Satoshi Sasaki, Takasaki (JP); Katsunari Nakazawa, Komoro (JP); Tetsuaki Adachi, Tobu (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 420 days.

(21) Appl. No.: 10/862,325

(22) Filed: Jun. 8, 2004

(65) Prior Publication Data

US 2005/0009484 A1    Jan. 13, 2005

(30) Foreign Application Priority Data

Jul. 9, 2003    (JP)    ............................. 2003-194063

(51) Int. Cl.
*H03F 3/14*    (2006.01)
(52) U.S. Cl. ...................................... 330/307; 330/302
(58) Field of Classification Search ................ 330/307, 330/302, 124 R, 295, 84, 126
See application file for complete search history.

(56) References Cited

U.S. PATENT DOCUMENTS

| | | | | |
|---|---|---|---|---|
| 6,621,347 B2 * | 9/2003 | Morimoto et al. | .......... | 330/295 |
| 6,734,728 B1 * | 5/2004 | Leighton et al. | .............. | 330/66 |
| 6,833,761 B2 * | 12/2004 | Staudinger et al. | ......... | 330/307 |

FOREIGN PATENT DOCUMENTS

JP    2002-141756    10/2000

* cited by examiner

*Primary Examiner*—Henry Choe
(74) *Attorney, Agent, or Firm*—Reed Smith LLP; Stanley P. Fisher, Esq.; Juan Carlos A. Marquez, Esq.

(57) ABSTRACT

Cross-band isolation characteristics are to be significantly improved without using any filtering circuit. In the central part of a semiconductor chip provided in an RF power module is formed a ground wiring layer from the upper part downward. This ground wiring layer is formed on the boundary between GSM side transistors and DCS side transistors for amplifying different frequency bands. Over the ground wiring layer are formed chip electrodes at equal intervals, and any one of the chip electrodes is connected via a bonding wire to a bonding electrode. The bonding electrode is formed over a module wiring board over which the semiconductor chip is to be mounted, and the ground wiring layer is connected to it. Harmonic signals are trapped by the ground wiring layer and the bonding wire.

4 Claims, 6 Drawing Sheets

HIGH FREQUENCY POWER AMPLIFIER MODULE AND SEMICONDUCTOR INTEGRATED CIRCUIT DEVICE

The present application claims priority from Japanese Application JP 2003-194063 filed on Jul. 9, 2003, the content of which is hereby incorporated by reference into this application.

BACKGROUND OF THE INVENTION

The present invention relates to a filtering technique for high frequency signals, and more particularly to a technique that can be effectively applied to the removal of harmonic contents propagating over the surface of a semiconductor chip or elsewhere.

In recent years, cellular phones have come into extensive use as one major means of mobile communication, and their functions are required to be even more diverse. For instance, the requirement for size reduction of high frequency power amplifier modules for cellular phones is particularly stringent, and to meet this requirement such modules which accommodate on a single chip communication formulas for different frequency bands, such as GSM and DCS, are extensively used.

Where communication formulas for different frequency bands are accommodated on a single chip, high frequency contents supplied from one frequency band affects the other frequency band and thereby seriously deteriorates the so-called cross-band isolation level.

For this reason, a filtering circuit consisting of a PIN diode and a capacitor is provided in the output matching circuit on the side where high frequency contents leak out in the high frequency power amplifier module to cope with this problem by filtering high frequency contents when one frequency band is put to work.

Incidentally, some such high frequency power amplifiers have in their output matching circuits a plurality of output side micro-split lines for delivering different signals, and prevent interference between one output side micro-split line and the other output side micro-split line by providing a plurality of GND lines between the output side micro-split lines (see Patent Reference 1 for instance).

Patent Reference 1: Japanese Unexamined Patent Publication No. 2002-141756

SUMMARY OF THE INVENTION

However, the present inventors discovered that the technique for improving cross-band isolation characteristics in such high frequency power amplifier modules involved the following problems.

Thus, since the filtering circuit is configured of discrete parts, the PIN diode and the capacitor occupy an extremely large area, thereby posing an impediment to size reductions of high frequency power amplifier modules.

Furthermore, the use of discrete parts means a correspondingly increased number of parts constituting a high frequency power amplifier module and accordingly an increased cost of the high frequency power amplifier module.

An object of the present invention, therefore is to provide a high frequency power amplifier module and a semiconductor integrated circuit device permitting removal of harmonic contents propagating over the surface of the semiconductor chip and its vicinities without using a filtering circuit and thereby achieving a significant improvement in cross-band isolation characteristics.

Another object of the invention is to provide a high frequency power amplifier module and a semiconductor integrated circuit device permitting an improvement in cross-band isolation characteristics.

The above-stated and other objects and novel features of the invention will become more apparent from the following description in the specification when taken in conjunction with the accompanying drawings.

Typical aspects of the invention disclosed in the present application will be briefly described below.

Thus, a high frequency power amplifier module according to the invention comprises first and second power amplifier sections, formed over a semiconductor chip, for amplifying high frequency signals of two different frequency bands; an input matching circuit for matching the impedances of signals to be entered into the first and second power amplifier sections; an output matching circuit for matching the impedances of signals to be supplied from the first and second power amplifier sections; and a module wiring board for mounting thereon the semiconductor chip, the input matching circuit and the output matching circuit, where in a reference potential region is formed between the first power amplifier section and second power amplifier section over the main face of the semiconductor chip; and the reference potential region is connected by way of a via hole to a reference potential layer provided over the back face of the semiconductor chip.

Other aspects of the invention under the present application will be briefly described below.

According to the invention, there is also provided a semiconductor integrated circuit device having first and second power amplifier sections for amplifying high frequency signals of two different frequency bands, provided with a reference potential region arranged between the first power amplifier section and second power amplifier section over the main face of the semiconductor chip, wherein the reference potential region is connected by way of a via hole to a reference potential layer formed over the back face of semiconductor chip.

DETAILED DESCRIPTION OF THE PREFERRED EMBODIMENTS

Next will be described preferred embodiments of the present invention with reference to the accompanying drawings.

(Embodiment 1)

Figure 1:
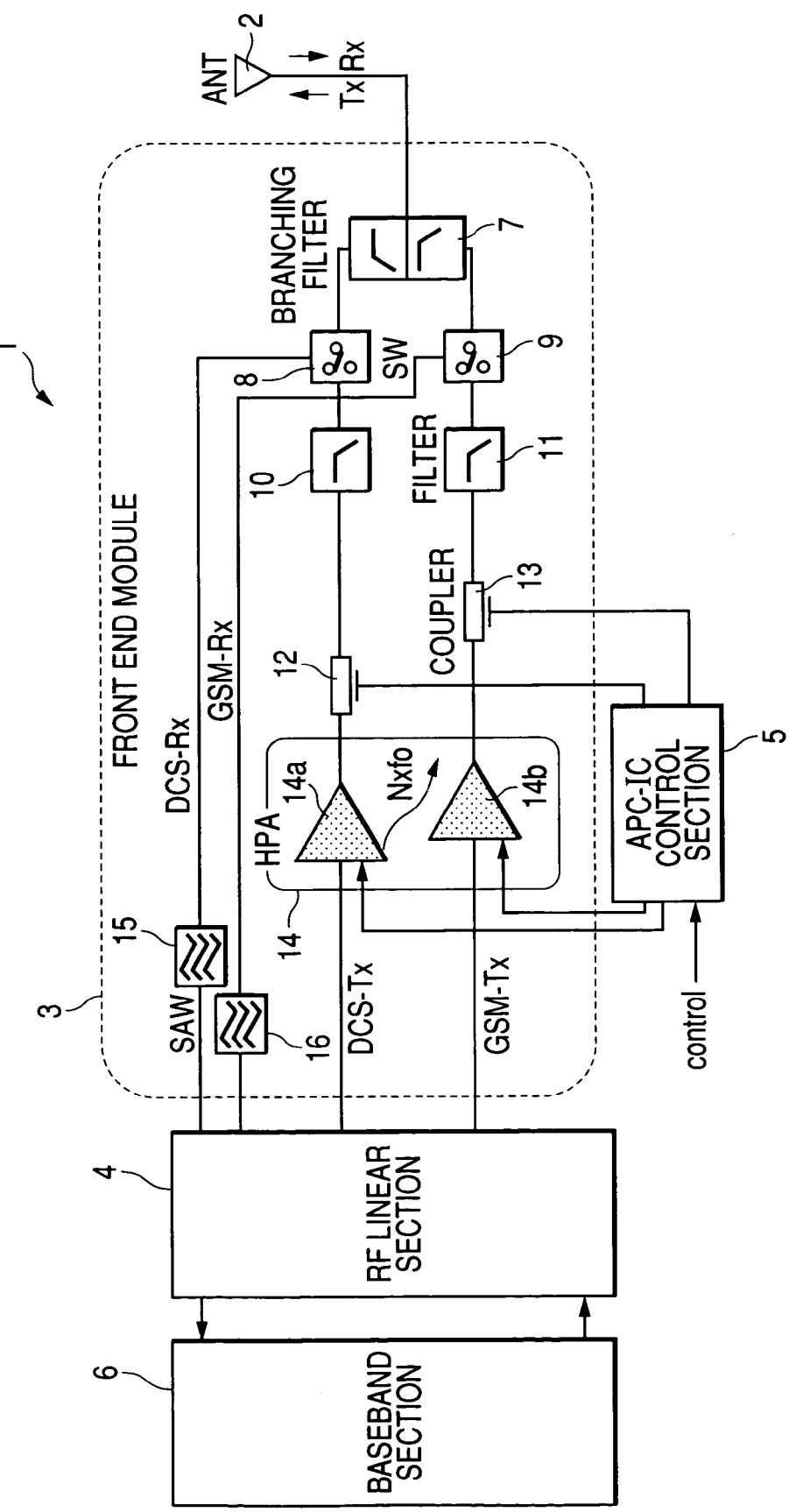
FIG. 1 is a block diagram of a dual band communication terminal, which is Embodiment 1 of the present invention.
Figure 2:
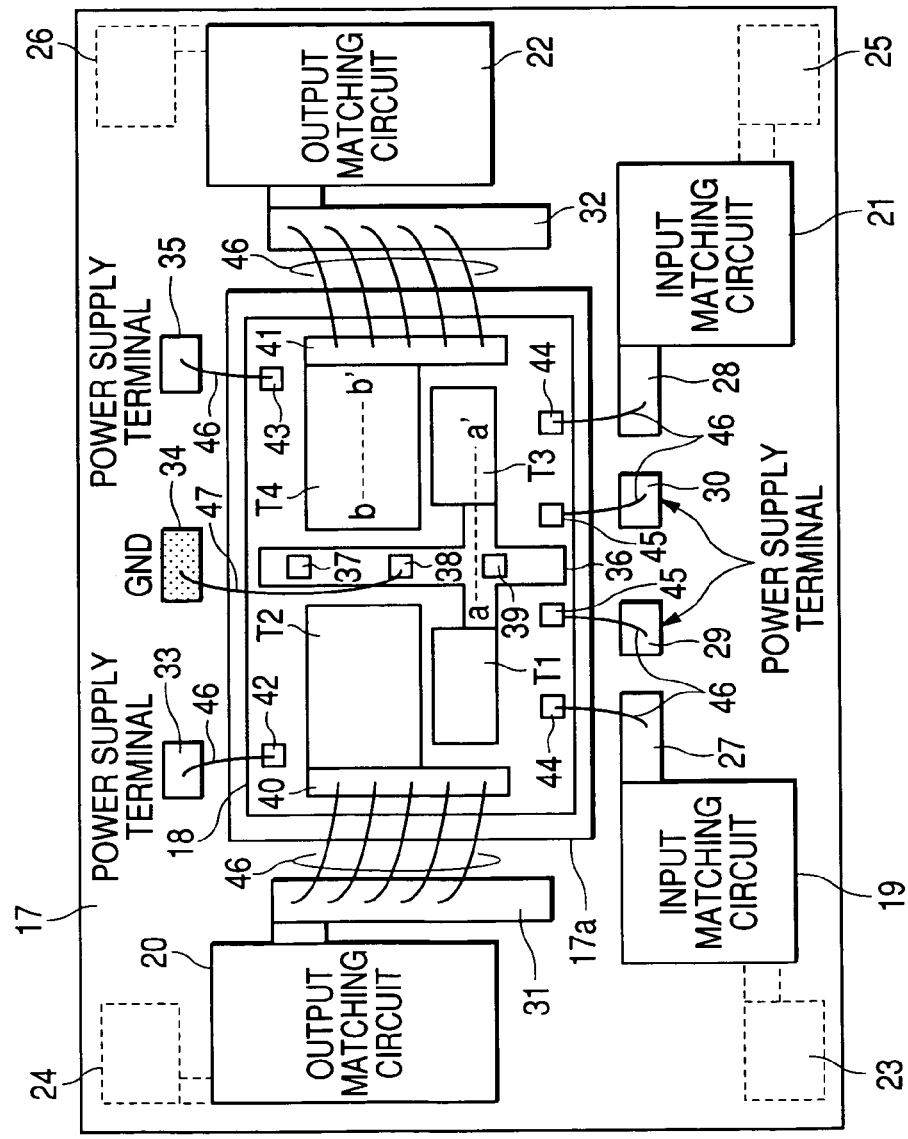
FIG. 2 shows the layout of the module wiring board of an RF power module provided in the dual band communication terminal of FIG. 1.
Figure 3:
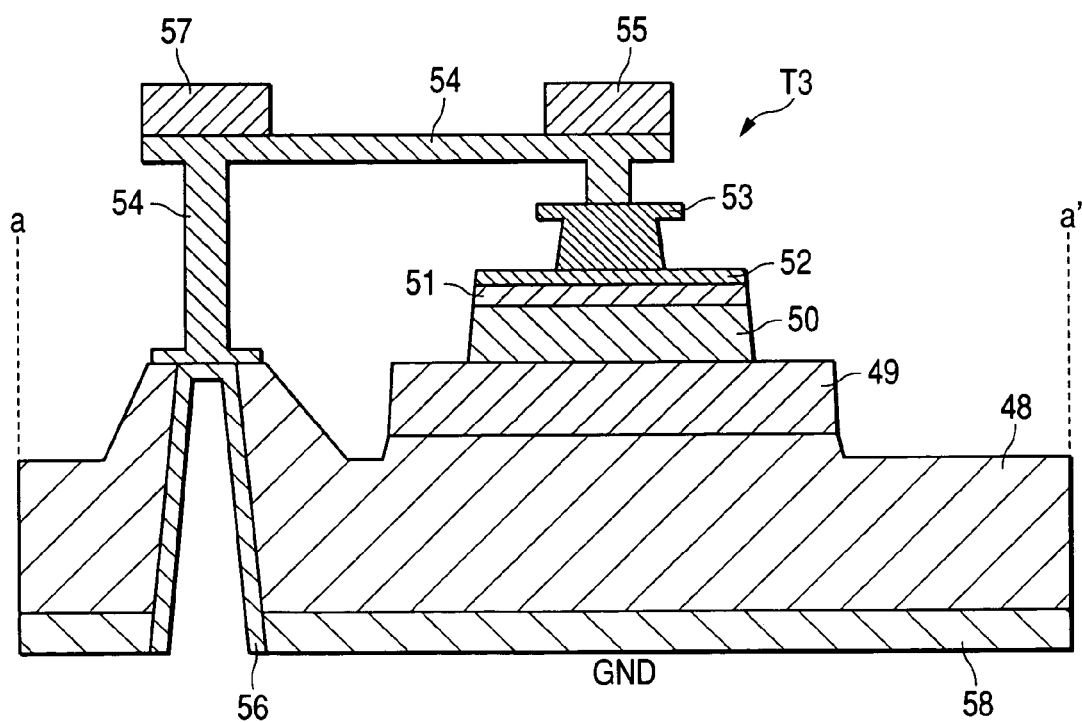
FIG. 3 shows the a–a' section of one of the transistors provided in the RF power module of FIG. 2.
Figure 4:
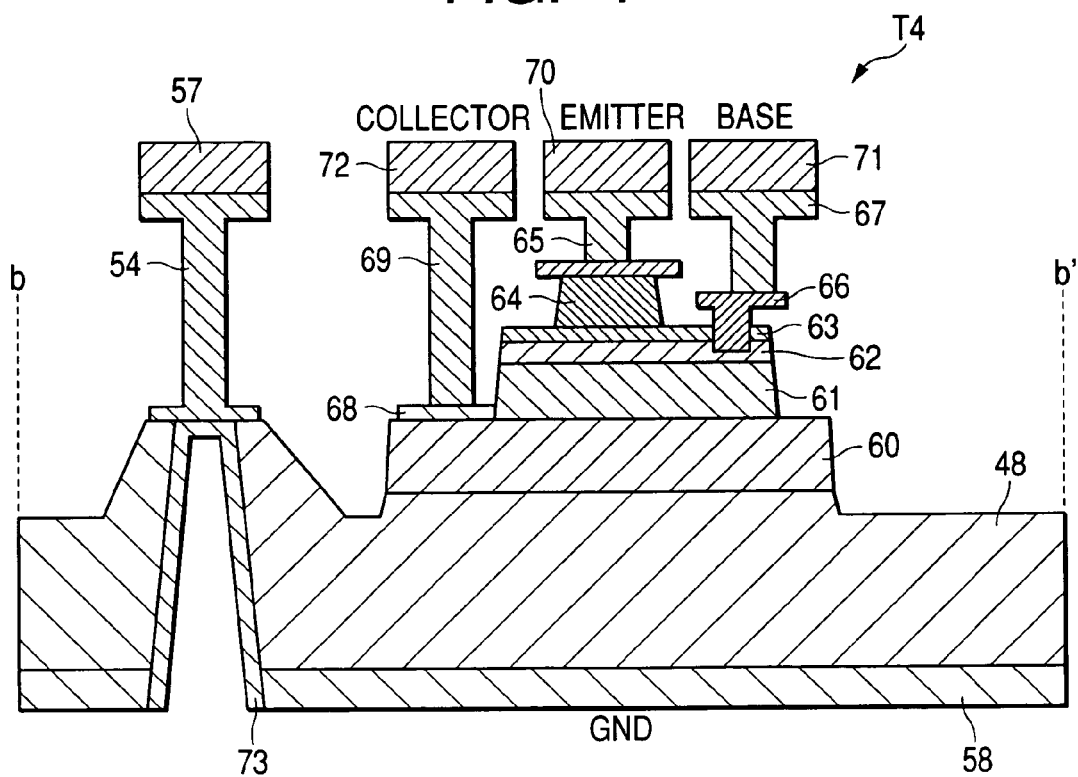
FIG. 4 shows the b–b' section of the other of the transistors provided in the RF power module of FIG. 2.
Figure 5:
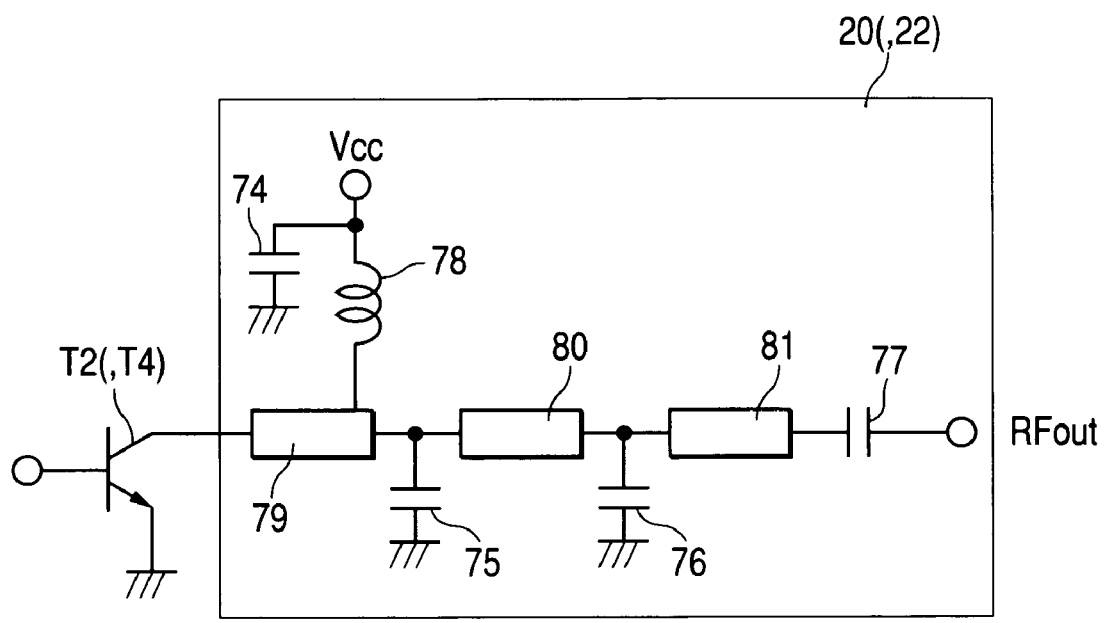
FIG. 5 is a circuit diagram showing one example of output matching circuit provided in the RF power module of FIG. 2.

FIG. 1 is a block diagram of a dual band communication terminal, which is Embodiment 1 of the present invention; FIG. 2 shows the layout of the module wiring board of an RF power module provided in the dual band communication terminal of FIG. 1; FIG. 3 shows the a–a' section of one of the transistors provided in the RF power module of FIG. 2; FIG. 4 shows the b–b' section of the other of the transistors provided in the RF power module of FIG. 2; and FIG. 5 is a circuit diagram showing one example of output matching circuit provided in the RF power module of FIG. 2.

In this Embodiment 1, a dual band communication terminal 1 is a communication system, which may be a cellular phone for instance. This dual band communication terminal 1 comprises an antenna for transmission/reception 2, a front end module 3, an RF linear section 4, an APC-IC control section 5, and a baseband section 6, as shown in FIG. 1.

The antenna for transmission/reception 2 transmits and receives signal waves. The front end module 3 branches high frequency signals (of 900 MHz/1.8 GHz bands) received by the antenna for transmission/reception 2 and amplifies the power high frequency signals to be transmitted.

The RF linear section 4 converts voice signals, entered from a microphone, into high frequency signals. The APC-IC control section 5 controls the output signal level. The baseband section 6 converts the frequency of received signals for voice processing.

The front end module 3 comprises a branching filter 7, transmission/reception change-over switches 8 and 9, filters 10 and 11, couplers 12 and 13, an RF power module (high frequency power amplifier module) 14, surface acoustic devices (SAWs) 15 and 16 and so forth.

The high frequency signals (of 900 MHz/1.8 GHz bands) received by the antenna for transmission/reception 2 are entered into the front end module 3 and, after being branched by the branching filter 7, are entered into a receiver circuitry provided in the RF linear section 4 via the transmission/ reception change-over switches 8 and 9 and either of the SAWs 15 and 16.

The SAWs 15 and 16 select signals of a specific frequency, which have propagated, as high frequency signals by utilizing the elastic surface wave of a piezoelectric.

The branching filter 7, configured of a high pass filter (HPF) passing a high frequency band (DCS band/1.8 GHz) and a low pass filter (LPF) passing a low frequency band (GSM band/900 MHz), separates the two frequencies of the dual bands. The transmission/reception change-over switches 8 and 9, consisting of PIN diodes for instance, change over between transmission and reception by controlling the turning on and off of biasing.

The entered signals, after undergoing frequency conversion, are entered into the baseband section 6, and undergoes voice processing by the baseband section 6.

Voice signals entered from the microphone undergo conversion into a high frequency by the RF linear section 4, and are entered into the RF power module 14 of the front end module 3. The RF power module 14, consisting of two power amplifier sections 14a and 14b, performs power amplification needed for transmission from the antenna for transmission/reception 2.

The power amplifier section (second power amplifier section) 14a amplifies power for high frequency signals of the DCS band, while the power amplifier section (first power amplifier section) 14b amplifies power for high frequency signals of the GSM band.

In this process, the RF power module 14 amplifies power on the basis of a control signal from the APC-IC control section 5. The APC-IC control section 5 detects signals from couplers 12 and 13, and generates a control signal for keeping the power supplied from the RF power module 14 constant. The couplers 12 and 13 pick out and feed back part of the output from the RF power module 14.

When the signals amplified by the RF power module 14 reach a prescribed level for output, they are supplied to the antenna for transmission/reception 2 via the transmission/reception change-over switches 8 and 9 and the branching filter 7 after being cleared of unnecessary harmonic contents by filters 10 and 11, which may consist of LPFs for instance.

FIG. 2 shows the layout of the module wiring board of the RF power module 14.

In a chip mounting area providing in a module wiring board 17 is mounted a semiconductor chip 18. To the left of and below the module wiring board 17 is laid out an input matching circuit 19 and above the input matching circuit 19 is laid out an output matching circuit 20.

To the right of and below the module wiring board 17 is laid out an input matching circuit 21 and above the input matching circuit 21 is laid out an output matching circuit 22.

These input matching circuits 19 and 21 and output matching circuits 20 and 22 are intended for optimizing impedance matching with external circuits to be connected and satisfying the requirements for input/output characteristics.

To the left of the semiconductor chip 18 are laid out, from the lower part upward, transistors T1 and T2, and to the right of the semiconductor chip 18 are laid out, from the lower part upward, transistors T3 and T4.

The input matching circuit 19, the output matching circuit 20 and the transistors T1 and T2 constitute the power amplifier section 14a, and the input matching circuit 21, the output matching circuit 22 and the transistors T3 and T4 constitute the power amplifier section 14b.

In the vicinities of the four corners of the back face of the module wiring board 17 are respectively arranged electrode sections 23 through 26. The electrode section 23 is connected to the input section of the input matching circuit 19, and the electrode section 24 is connected to the output section of the output matching circuit 20. The electrode section 25 is connected to the input section of the input matching circuit 21, and the electrode section 26 is connected to the output section of the output matching circuit 22.

To the right of the input matching circuit 19 is provided a bonding electrode 27, and to the left of the input matching circuit 21 is provided a bonding electrode 28. Bonding electrodes 29 and 30 are provided between the bonding electrode 27 and the bonding electrode 28.

The bonding electrodes 27 and 28 are connected to the respective output sections of the input matching circuits 19 and 21. To the bonding electrodes 29 and 30 is supplied a source voltage Vbb.

To the right of the output matching circuit 20 is provided a bonding electrode 31, and to the left of the output matching circuit 22 is provided a bonding electrode 32. These bonding electrodes 31 and 32 are connected to the respective input sections of the output matching circuits 20 and 22.

Above the semiconductor chip 18 are arranged, from left to right, bonding electrodes 33 through 35. To the bonding electrodes 33 and 35 is supplied a source voltage VCC, and to the bonding electrode 34 is connected a ground (reference potential) wiring layer in the module wiring board 17.

Further in the semiconductor chip 18 is formed, from the upper part downward, a ground wiring layer (reference potential region) 36. This ground wiring layer 36 is also formed from the transistor T1 to the transistor T3, and connected to the emitters of the transistors T1 and T3.

Over the ground wiring layer 36 extending from the upper to the lower part of the semiconductor chip 18 are formed, for instance, three chip electrodes 37 through 39 at any desired intervals. The chip electrodes 37 through 39 are connected to the ground wiring layer 36.

To the left of the transistors T1 and T2 is formed a chip electrode 40, and to the right of the transistors T3 and T4 is formed a chip electrode 41. Above the transistors T2 and T4 are formed chip electrodes 42 and 43, respectively, and underneath the transistors T1 and T3 are formed chip electrodes 44 and 45, respectively.

To these bonding electrodes 27 through 33 and 35 are connected chip electrodes 40 through 44, respectively, via a bonding wire 46. To the bonding electrode 34 is connected one of the chip electrodes 37 through 39 (the chip electrode 38 in this example) via a bonding wire (bonding wire for trapping) 47.

This bonding wire 47, which is a wire for trapping harmonic signals, traps harmonic signals propagating to the upper part of the semiconductor chip 18 from the GSM side (the transistors T1 and T2) toward the DCS side (the transistors T3 and T4).

Harmonic signals propagating over the surface of the semiconductor chip 18 is isolated by the ground wiring layer 36 formed over the boundary between the GSM side (the transistors T1 and T2) and the DCS side (the transistors T3 and T4).

FIG. 3 shows the a–a' section of the transistor T3 of FIG. 2.

In the transistor T3 are formed, over the main face of a semiconductor substrate 48 consisting of gallium arsenide (GaAs) or the like, a subcollector 49, a collector 50, a base 51, and an emitter 52, stacked one over another.

The subcollector 49, the collector 50 and the base 51 are formed of GaAs, and the subcollector 49 has a higher concentration of impurities than the collector 50.

The emitter 52 is formed of indium gallium phosphide (InGaP). An emitter electrode 53 formed of gold (Au) is formed over the emitter 52.

Over the emitter electrode 53 is formed an inner layer wiring 54 consisting of Au for instance, and over the surface of an inner layer wiring 54 over the emitter electrode 53 is formed a surface layer wiring 55 plated with Au or the like.

The emitter 52 is connected to a via hole 56 by way of the inner layer wiring 54. The via hole 56 is a through hole which electrically connects the main and back faces of the semiconductor substrate 48.

Above this via hole 56 and in the part over the inner layer wiring 54 is formed a surface layer wiring 57 plated with Au or the like. The surface layer wiring 57 constitutes the ground wiring layer 36 (FIG. 2).

Over the whole back side face of the semiconductor substrate 48 is formed a back face wiring (reference potential layer) 58. This back face wiring 58 constitutes a ground wiring layer plated with Au for instance.

The via hole 56 is connected to the back face wiring 58, and the emitter 52 in the transistor T3 is grounded via the inner layer wiring 54, the via hole 56, and the back face wiring 58.

FIG. 4 shows the b–b' section of the transistor T4 of FIG. 2.

In the transistor T4 are formed, over the main face of the semiconductor substrate 48, a subcollector 60, a collector 61, a base 62 and an emitter 63, stacked one over another.

In the transistor T4 as well, the subcollector 60, the collector 61 and the base 62 are formed of GaAs, and the subcollector 60 has a higher concentration of impurities than the collector 61.

The emitter 63 is formed of InGaP. Over this emitter 6 is formed an emitter electrode 64 consisting of gold (Au) for instance.

Over the emitter electrode 64 are inner layer wiring 65 consisting of Au for instance and a base electrode 66. An inner wiring 67 consisting of Au or the like is formed over the base electrode 66.

A collector electrode 68 is formed over the subcollector 60, and an inner layer wiring 69 consisting of Au or the like is formed over the collector 68.

Over these inner layer wirings 65, 67 and 69 are respectively formed surface wiring layers 70 through 72 plated with Au of the like, and the surface wiring layers 70 through 72 constitutes the emitter, base and collector, respectively, of the transistor T4.

In the part of the semiconductor substrate 48 to the left of the transistor T4 is formed a via hole 73 connected to the back face wiring 58 formed over the back face of the semiconductor substrate 48.

The inner layer wiring 54 shown in FIG. 3 is formed over this via hole 73. The surface layer wiring 57, which is to constitute the ground wiring layer 36 (FIG. 2) shown in FIG. 3, is formed over the inner layer wiring 54.

FIG. 5 shows one example of configuration or the output matching circuit 20 (or 22).

The output matching circuit 20 (or 22) is configured of capacitors 74 through 77, a coil 78 and transmission routes 79 through 81. The transmission routes 79 through 81 are inductors each consisting of a wiring pattern formed over the module wiring board 17.

The collector of the transistor T2 (or T4) is connected to the transmission route 79 which is to constitute the input section of the output matching circuit 20 (or 22). To the output section of this transmission route 79 are connected the other connecting part of the coil 78, one connecting part of the capacitor 75 and the input section of the transmission route 80.

The source voltage VCC is connected to one connecting part of the coil 78 and one connecting part of the capacitor 74. One connecting part of the capacitor 76 and the input section of the transmission route 81 are connected to the output section of the transmission route 80. A reference potential (VSS) is connected to the other connecting parts of the capacitors 74 through 76.

To the output section the transmission route 81 is connected one connecting part of connected one connecting part of the capacitor 77, and the other connecting part of the capacitor 77 constitutes the output section RFout of the output matching circuit 20 (or 22).

In this Embodiment 1, as the presence of the bonding wire 47 and the ground wiring layer 36 makes possible trapping of harmonic signals propagating on and above the surface of the semiconductor chip 18, cross-band isolation characteristics of the RF power module 14 can be improved.

Furthermore, as no circuits against cross-band isolation, such as PIN diodes or capacitors, are needed in the output matching circuits 20 and 22, the size of the RF power module 14 can be significantly reduced.

(Embodiment 2)

Figure 6:
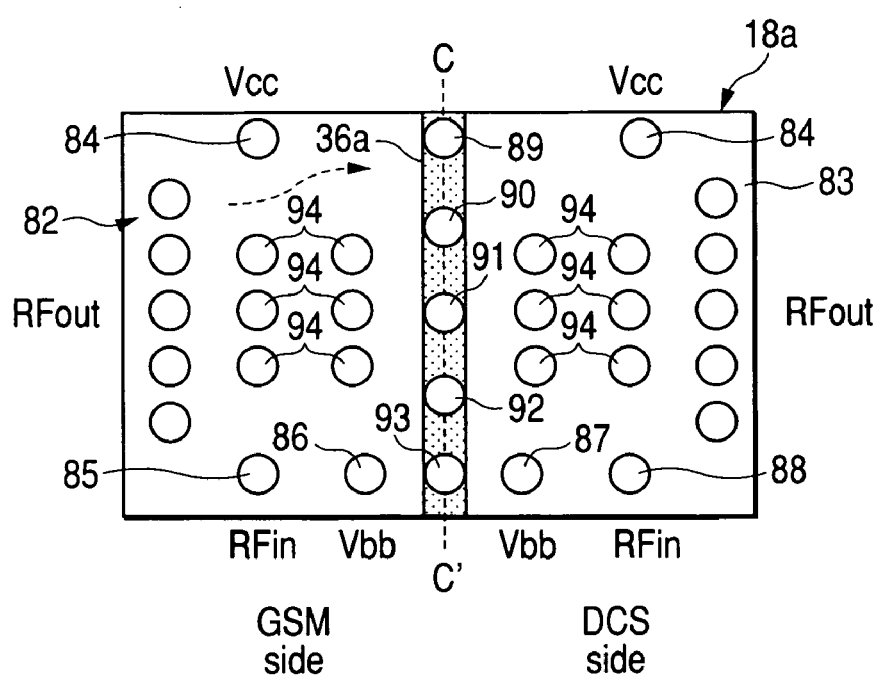
FIG. 6 shows the layout of bumps in a semiconductor chip provided in an RF power module in Embodiment 2 of the invention.
Figure 7:
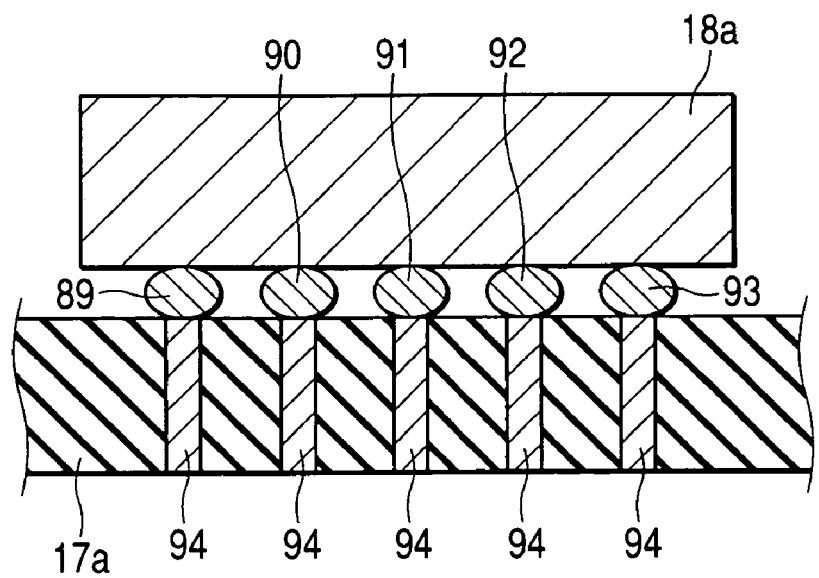
FIG. 7 shows the c–c' section of the semiconductor chip of FIG. 6 when bonded face-down to the module wiring board.

FIG. 6 shows the layout of bumps in a semiconductor chip provided in an RF power module in Embodiment 2 of the invention; FIG. 7, the c–c' section of the semiconductor chip of FIG. 6 when bonded face-down to the module wiring board; and FIG. 8, the c–c' section of the semiconductor chip of FIG. 6 when bonded face-up to the module wiring board.

In this Embodiment 2, an RF power module, like its counterpart in Embodiment 1 described above, comprises the power amplifier section 14*a* (FIG. 1) consisting of an input matching circuit, an output matching circuit and two transistors, and the power amplifier section 14*b* (FIG. 1) consisting of an input matching circuit, an output matching circuit and two transistors.

The layout of these transistors is the same as in the semiconductor chip 18 of Embodiment 1 described above. Over the main face of a semiconductor chip 18*a*, to the left of the semiconductor chip 18*a* from the lower part upward the transistors T1 and T2 (FIG. 2) are laid out, and to the right of the semiconductor chip 18*a* from the lower part upward the transistors T3 and T4 (FIG. 2) are laid out.

FIG. 6 shows the layout of bumps, which are to constitute external terminals, in the semiconductor chip 18*a*.

Over the main face of the semiconductor chip 18*a* are formed bumps 82 through 94 consisting of Au or the like. In the vicinities of the left side of the semiconductor chip are formed, for instance, five bumps 82 at equal intervals. To these bumps 82 is connected the collector of the transistor T2.

In the vicinities of the right side of the semiconductor chip are formed, for instance, five bumps 83, to which is connected the collector of the transistor T4. These bumps 82 and 83 constitute the output sections RFout of the transistors T2 and T4.

On the left and right sides of the upper part of the semiconductor chip 18*a* are formed two bumps 84 to which the source voltage VCC is connected, and in the lower part of the semiconductor chip 18*a* are formed, from left to right, bumps 85 through 88.

The bumps 85 and 88, to which the bases of the transistors T1 and T3 are connected, constitute input sections RFin for RF signals of the input matching circuit are the preceding stage. To the bumps 86 and 87 is connected the source voltage Vbb.

In the central part of the semiconductor chip 18*a*, from the upper part downward, five bumps (bumps for trapping) 89 through 93, for instance, are formed at equal intervals, and these bumps 89 through 93 are commonly connected to a ground wiring layer 36*a* formed among the wiring layers of the semiconductor chip 18*a*.

Between the plurality of bumps 82 and the bumps 89 through 93 and between the plurality of bumps 83 and the bumps 89 through 93 are formed a plurality of bumps 94 in an array shape. These bumps 94 are for grounding (reference potential), and connected to the ground wiring layer of a module wiring board 17*a* (FIG. 7).

In this case, harmonic signals propagating over the semiconductor chip 18*a* from the GSM side (the transistors T1 and T2) to the DCS side (the transistors T3 and T4) are trapped by the bumps 89 through 93, and harmonic signals propagating over the surface of the semiconductor chip 18*a* are isolated by the ground wiring layer 36*a*.

FIG. 7 shows the c–c' section of the semiconductor chip 18*a* of FIG. 6 when bonded face-down to the module wiring board 17*a*.

The bumps 89 through 93 of the semiconductor chip 18*a* are connected to electrode sections formed over the main face of the module wiring board 17*a*. These electrode sections are connected via through holes 94 to a ground wiring layer formed over the back face of the module wiring board 17*a*.

Over the main face of the module wiring board 17*a* are formed electrode sections to which other bumps 82 through 88 and 94 are connected. These electrode sections are connected via through holes and patterned wiring formed over the back face of the module wiring board 17*a* to electrode sections also formed over the back face of the module wiring board 17*a*.

Solder bumps and the like are formed over the electrode sections formed on the back face of the module wiring board 17*a*, and the electrode sections are mounted over the printed circuit board via these solder bumps.

Figure 8:
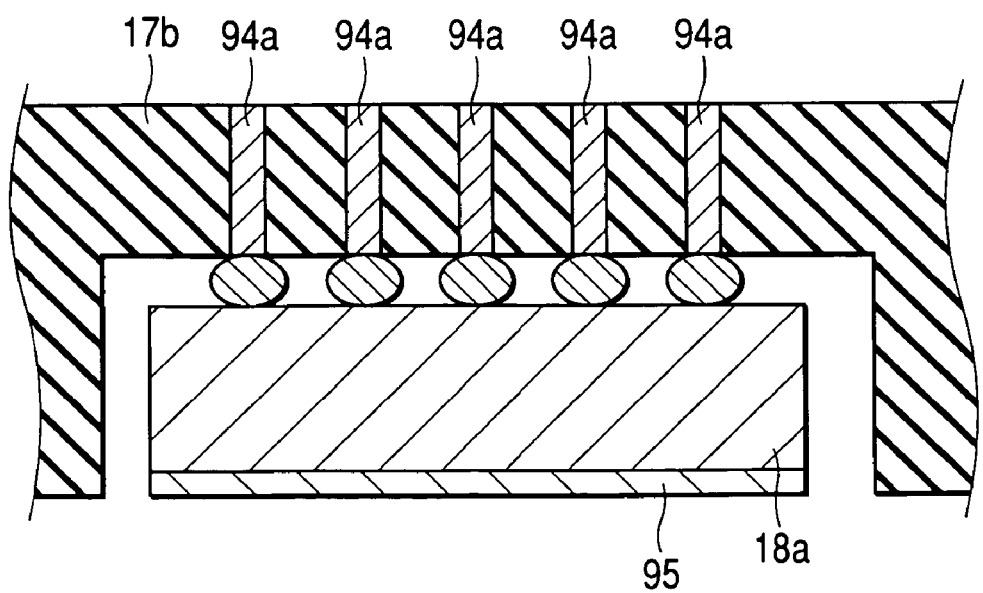
FIG. 8 shows the c–c' section of the semiconductor chip of FIG. 6 when bonded face-up to the module wiring board.

FIG. 8 shows the c–c' section of the semiconductor chip 18*a* of FIG. 6 when bonded face-up to the module wiring board 17*b*.

The bumps 89 through 93 of the semiconductor chip 18*a* are connected to electrode sections formed in the chip mounting part over the back face of the module wiring board 17*b*. These electrode sections are connected via through holes 94*a* to a ground wiring layer formed over the main face of the module wiring board 17*b*.

Over the back face of the module wiring board 17*b* are formed electrode sections to which other bumps 82 through 88 and 94 (FIG. 6) are connected. These electrode sections are connected via through holes and patterned wiring formed over the main face of the module wiring board 17*b* to electrode sections also formed over the main face of the module wiring board 17*b*.

In the electrode sections formed over the back face of the module wiring board 17*b* are formed, for instance, solder bumps and the like, and the electrode sections are mounted over the printed circuit board via these solder bumps. In this mounting process, the back face of the semiconductor chip 18*a* is also mounted over the printed circuit board via, for instance, gold paste 95 or the like.

Also in this Embodiment 2, since harmonic signals propagating on and above the surface of the semiconductor chip 18*a* can be trapped by the bumps 89 through 93 and the ground wiring layer 36*a*, cross-band isolation characteristics of the RF power module can be improved.

Furthermore, as no circuits against cross-band isolation, such as PIN diodes or capacitors, are needed in the output matching circuits, the size of the RF power module can be significantly reduced.

While the invention achieved by the present invention has been hitherto described with reference to specific embodiments thereof, the invention is not limited to these embodiments. Obviously the invention can be embodied in various other ways without deviating from its essentials.

Advantages achieved by some of the most typical aspects of the invention disclosed in the present application will be briefly described below.

(1) Cross-band isolation characteristics in a semiconductor chip for amplifying high frequency signals of different frequency bands can be improved.

(2) Also, since the output matching circuit requires no external circuit against cross-band isolation, the semiconductor integrated circuit device and the high frequency power amplifier module can be significantly reduced in size.

What is claimed is:

1. A high frequency power amplifier module comprising:
   first and second power amplifier sections, formed over a semiconductor chip, for amplifying high frequency signals of two different frequency bands;
   an input matching circuit for matching impedances of signals to be entered into said first and second power amplifier sections;
   an output matching circuit for matching the impedances of signals to be supplied from said first and second power amplifier sections; and
   a module wiring board for mounting thereover said semiconductor chip, said input matching circuit and said output matching circuit,
   wherein a reference potential region is formed between said first power amplifier section and second power amplifier section over a main face of said semiconductor chip, and
   wherein said reference potential region is connected by way of a via hole to a reference potential layer provided over a back face of said semiconductor chip.

2. The high frequency power amplifier module according to claim 1,
   wherein a plurality of bumps for trapping are formed in the reference potential region formed over the main face of said semiconductor chip.

3. The high frequency power amplifier module according to claim 1,
   wherein a bonding wire for trapping is connected to the reference potential region formed over the main face of said semiconductor chip, and
   wherein said reference potential region is connected via said bonding wire for trapping to a reference potential wiring layer formed over said module wiring board.

4. The high frequency power amplifier module according to claim 3,
   wherein said bonding wire for trapping is positioned near the transistor of the final stage provided in the first power amplifier section for amplifying high frequency signals of the lower frequency band of two different frequency bands.

* * * * *